United States Patent
Kim et al.

(10) Patent No.: US 9,172,000 B2
(45) Date of Patent: Oct. 27, 2015

(54) SEMICONDUCTOR LIGHT EMITTING DEVICE AND METHOD OF MANUFACTURING THE SAME

(75) Inventors: Tae Hun Kim, Gyunggi-do (KR); Gi Bum Kim, Gyunggi-do (KR); Won Goo Hur, Incheon (KR); Young Sun Kim, Gyunggi-do (KR); Ki Sung Kim, Gyunggi-do (KR)

(73) Assignee: SAMSUNG ELECTRONICS CO., LTD., Seoul (KR)

( * ) Notice: Subject to any disclaimer, the term of this patent is extended or adjusted under 35 U.S.C. 154(b) by 573 days.

(21) Appl. No.: 13/167,396

(22) Filed: Jun. 23, 2011

(65) Prior Publication Data

US 2012/0025246 A1 Feb. 2, 2012

(30) Foreign Application Priority Data

Jul. 2, 2010 (KR) ........................ 10-2010-0063790

(51) Int. Cl.
*H01L 21/00* (2006.01)
*H01L 51/40* (2006.01)
(Continued)

(52) U.S. Cl.
CPC .............. *H01L 33/22* (2013.01); *H01L 33/0079* (2013.01); *H01L 2933/0091* (2013.01)

(58) Field of Classification Search
CPC ....... H01L 33/025; H01L 33/22; H01L 33/24; H01L 2933/0083; H01L 21/0243; H01L 21/02658; H01L 21/0337; H01L 21/3086; H01L 33/54; H01L 33/501; H01L 2924/12041; B81C 1/00031; C23C 24/103

USPC ............ 438/29, 46–47, 22, 42; 257/E21.089, 257/E21.495
See application file for complete search history.

(56) References Cited

U.S. PATENT DOCUMENTS

| | | | | |
|---|---|---|---|---|
| 5,877,870 A | * | 3/1999 | Sakai | 358/438 |
| 6,780,491 B1 | * | 8/2004 | Cathey et al. | 428/143 |
| 6,844,569 B1 | * | 1/2005 | Lee et al. | 257/79 |

(Continued)

FOREIGN PATENT DOCUMENTS

| JP | 2008-270416 | 11/2008 |
|---|---|---|
| KR | 10-0593939 B1 | 6/2006 |

(Continued)

OTHER PUBLICATIONS

Ogawa et al., English Machine Translated of TW Publication No. 2010/13778A1, Apr. 1, 2010; (Machine Translated Mar. 9, 2015).*

(Continued)

*Primary Examiner* — Mohsen Ahmadi
(74) *Attorney, Agent, or Firm* — McDermott Will & Emery LLP (57) ABSTRACT

Disclosed are a semiconductor light emitting device and a method of manufacturing the same. The method includes providing a substrate having first and second main surfaces opposing each other and forming a first uneven structure in the first main surface, forming a sacrificial layer on the first main surface of the substrate, forming a mask having open regions on the sacrificial layer so as to expose a portion of an upper surface of the sacrificial layer, forming a second uneven structure in the substrate by etching the sacrificial layer and the substrate through the open regions, removing the sacrificial layer and the mask from the substrate, and forming a light emitting stack on the first and second uneven structures of the substrate.

23 Claims, 7 Drawing Sheets

(51) Int. Cl.
*H01L 33/22* (2010.01)
*H01L 33/00* (2010.01)

(56) References Cited

U.S. PATENT DOCUMENTS

| | | | |
|---|---|---|---|
| 7,037,738 B2 * | 5/2006 | Sugiyama et al. | 438/29 |
| 8,053,811 B2 * | 11/2011 | Hiramatsu et al. | 257/190 |
| 8,552,445 B2 * | 10/2013 | Wakai et al. | 257/98 |
| 2005/0110033 A1 * | 5/2005 | Heremans et al. | 257/98 |
| 2007/0018187 A1 | 1/2007 | Lee et al. | |
| 2008/0035953 A1 | 2/2008 | Beom et al. | |
| 2008/0308943 A1 * | 12/2008 | Kawakita | 257/773 |
| 2009/0078954 A1 * | 3/2009 | Shim et al. | 257/98 |
| 2010/0021985 A1 * | 1/2010 | Mason | 435/174 |
| 2010/0065868 A1 * | 3/2010 | Kitagawa et al. | 257/98 |
| 2010/0090230 A1 * | 4/2010 | Honma | 257/89 |
| 2011/0042711 A1 * | 2/2011 | Choi et al. | 257/103 |
| 2011/0111173 A1 * | 5/2011 | Ogawa et al. | 428/141 |

FOREIGN PATENT DOCUMENTS

| | | |
|---|---|---|
| KR | 10-2007-110688 | 11/2007 |
| KR | 10-2008-081676 | 9/2008 |
| KR | 10-2009-047852 | 5/2009 |

OTHER PUBLICATIONS

Chinese Office Action with English translation issued in Chinese Application No. 201110185733.3 mailed Jun. 9, 2013.
Notification of Third Office Action Chinese Patent Application No. 201110185733.3 dated Mar. 31, 2014 with full English translation.

* cited by examiner

FIG. 16

SEMICONDUCTOR LIGHT EMITTING DEVICE AND METHOD OF MANUFACTURING THE SAME

CROSS-REFERENCE TO RELATED APPLICATIONS

This application claims the priority of Korean Patent Application No. 10-2010-0063790 filed on Jul. 2, 2010, in the Korean Intellectual Property Office, the disclosure of which is incorporated herein by reference.

BACKGROUND OF THE INVENTION

1. Field of the Invention

The present invention relates to a semiconductor light emitting device and a method of manufacturing the same.

2. Description of the Related Art

A light emitting diode (LED) is one type of semiconductor light emitting device. In an LED, energy is released in the form of light due to electron-hole recombination in a p-n junction structure. That is, when a forward voltage is applied to a semiconductor of a specific element, electrons recombine with electron holes through a p-n junction, and an energy level therein becomes lower than in the case in which electrons and holes are separated. By this energy difference, an LED emits light to the outside.

At this time, the light is generated from an active layer, passes through an individual stack constituting a light emitting device, and is finally radiated to the outside. Meanwhile, an air layer forming the outer atmosphere of the light emitting device is a low refractive index layer having a refractive index of approximately 1, while the outermost layer of the light emitting device has a relatively high refractive index. Normally, when light is made incident onto a layer having a lower refractive index from a layer having a higher refractive index, the incident light is not entirely radiated but partially reflected, thereby impairing the light extraction efficiency of the light emitting device. Thus, a portion of light emitted from a light emitting region may be trapped within a light emitting structure without being radiated to the outside, thereby undermining light extraction efficiency. To address this issue in the related art, there has been an attempt to induce a change in a light path by forming an uneven structure in the outer part of a light emitting structure or the surface of a substrate.

SUMMARY OF THE INVENTION

An aspect of the present invention provides a semiconductor light emitting device having a multiple uneven structure to thereby achieve enhanced light extraction efficiency, and a method of manufacturing the same.

According to an aspect of the present invention, there is provided a method of manufacturing a semiconductor light emitting device, the method including: providing a substrate having first and second main surfaces opposing each other, and forming a first uneven structure in the first main surface; forming a sacrificial layer on the first main surface of the substrate; forming a mask having open regions on the sacrificial layer so as to expose a portion of an upper surface of the sacrificial layer; forming a second uneven structure in the substrate by etching the sacrificial layer and the substrate through the open regions; removing the sacrificial layer and the mask from the substrate; and forming a light emitting stack on the first and second uneven structures of the substrate.

The forming of the mask may include: forming a metal layer on the sacrificial layer; and aggregating the metal layer to form a plurality of clusters.

The metal layer may have a thickness ranging from 10 Å to 250 Å. The plurality of clusters formed by the aggregating of the metal layer may be irregular in size and interval.

At least part of the open regions of the mask may be nano-sized.

The aggregating of the metal layer may be performed by subjecting the metal layer to a thermal treatment. The thermal treatment is conducted under a temperature condition of between 300° C. to 650° C.

At least part of the second uneven structure may be formed by etching convex portions of the first uneven structure.

The sacrificial layer may include a material selected from the group consisting of a silicon oxide, a silicon nitride, and a titanium oxide.

The sacrificial layer may be formed to have a shape corresponding to a shape of the first uneven structure.

The sacrificial layer may be formed of a porous material.

The removing of the mask and the sacrificial layer from the substrate may include etching the sacrificial layer to separate the mask from the substrate.

The etching of the sacrificial layer may be performed by using a wet etching process. The wet etching process may form an additional uneven structure in the substrate. The additional uneven structure may be smaller than the first and second uneven structures in size.

The first uneven structure may be greater than the second uneven structure in size.

The first uneven structure may be on a micrometer (μm) scale and the second uneven structure may be on a nanometer (nm) scale.

The first uneven structure may include convex portions that are constant in shape and interval.

The first uneven structure may include convex portions having a dome shape.

The first uneven structure may include convex portions having a conical shape or polygonal pyramid shape.

The forming of the second uneven structure in the substrate by etching the sacrificial layer and the substrate may be performed by using a dry etching process.

The dry etching process may etch the sacrificial layer and the substrate at the same time.

The method may further include separating the substrate from the light emitting stack after the forming of the light emitting stack.

In the separating of the substrate, the first and second uneven structures of the substrate may be transferred onto one surface of the light emitting stack.

The forming of the light emitting stack may include sequentially growing a first conductivity type semiconductor layer, an active layer and a second conductivity type semiconductor layer on the first and second uneven structures of the substrate.

The first conductivity type semiconductor layer may be grown to fill the second uneven structure.

The first conductivity type semiconductor layer may be grown without filling the second uneven structure.

According to another aspect of the present invention, there is provided a semiconductor light emitting device including: a substrate having first and second main surfaces; a first uneven structure formed in the first main surface of the substrate and comprising convex portions; a second uneven structure formed in the first main surface of the substrate and having a size smaller than that of the first uneven structure, the second uneven structure being irregular in size and interval;

and a light emitting stack formed on the first and second uneven structures of the substrate and having first and second conductivity type semiconductor layers and an active layer therebetween.

The convex portions of the first uneven structure may be constant in shape and interval.

The convex portions of the first uneven structure may have a dome shape.

The convex portions of the first uneven structure may have a conical shape or a polygonal pyramid shape.

At least part of the second uneven structure may be nano-sized.

The substrate may have electrically insulating and light transmitting properties.

The first conductivity type semiconductor layer may be disposed without filling the second uneven structure.

The second uneven structure and the first conductivity type semiconductor layer may have air gaps interposed therebetween.

The first conductivity type semiconductor layer may be disposed while filling the second uneven structure.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements.

Hereinafter, exemplary embodiments of the present invention will be described.

Figure 1:
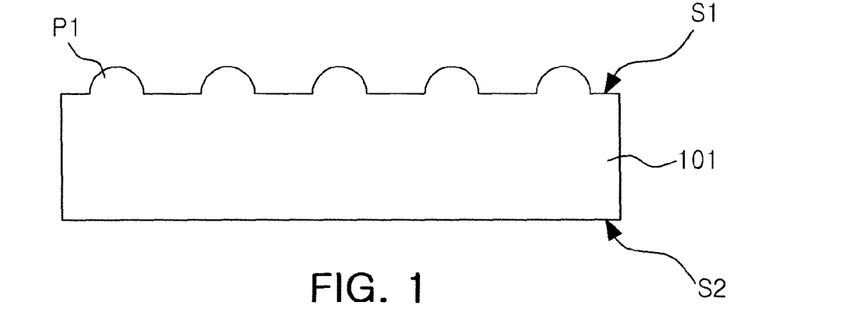
FIGS. 1 through 13 are schematic cross-sectional views for explaining a method of manufacturing a semiconductor light emitting device according to an exemplary embodiment of the present invention.

FIGS. 1 through 12 are schematic cross-sectional views illustrating a method of manufacturing a semiconductor light emitting device according to an exemplary embodiment of the present invention. First, as shown in FIG. 1, a first uneven structure P1 is formed in a substrate 101. In detail, the substrate 101 has first and second main surfaces S1 and S2. The first uneven structure P1 is formed in the first main surface S1. A semiconductor growth substrate is used as the substrate 101, and may utilize a substrate formed of an insulating or conductive material such as sapphire, SiC, $MgAl_2O_4$, MgO, $LiAlO_2$, $LiGaO_2$, GaN or the like. In this case, the sapphire having electrically insulating properties and light transmitting properties may be the most desirable material. The sapphire is a crystal having Hexa-Rhombo R3c symmetry, and has a lattice constant of 13.001 Å along a C-axis and a lattice constant of 4.758 Å along an A-axis. Orientation planes of the sapphire substrate include a C (0001) plane, an A (1120) plane, an R (1102) plane and the like. In this case, the C plane is mainly used as a substrate for nitride growth because it relatively facilitates the growth of a nitride film and is stable at a high temperature.

The first uneven structure P1 may be formed by using a known patterning process such as anisotropic etching, and may have convex portions having a rough dome shape as shown in FIG. 1. The convex portions of the first uneven structure P1 may be arranged to be constant in terms of size and interval, unlike a second uneven structure to be described later, and may have a size on a micrometer (μm) scale.

Figure 2:
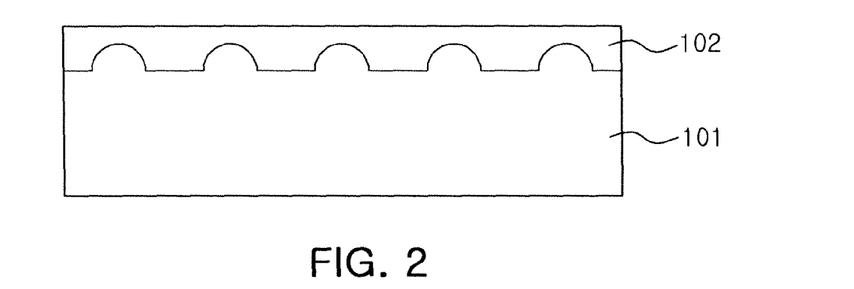

Thereafter, as shown in FIG. 2, a sacrificial layer 102 is formed on the substrate 101. The sacrificial layer 102 is provided for ease of the removal of a metal cluster mask after an uneven portion is formed in the substrate 101 in a subsequent process. The sacrificial layer 102 may be formed of a material such as $SiO_2$, $SiN_x$, $TiO_2$, polyimide or the like. A method of forming the sacrificial layer 102 will not be specifically illustrated since it may be formed by using a method equivalent to a general epitaxial thin film forming method such as PECVD or MOCVD, or a spin-coating method (in the case of polyimide). At this time, the sacrificial layer 102 may be formed under temperature conditions of approximately 100° C. to 300° C., which are somewhat lower than a temperature at which a silicon oxide or the like is formed in general. Thus, the sacrificial layer 102 may have porous properties, and the porous property of the sacrificial layer 102 may facilitate the removal thereof in a subsequent etching process.

Figure 3:
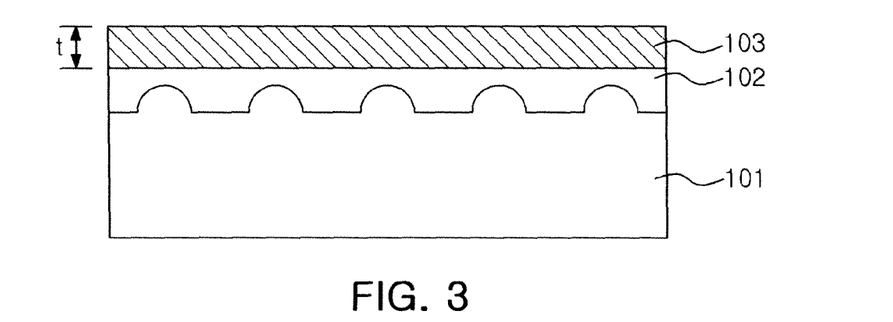

Thereafter, as shown in FIG. 3, a metal layer 103 is formed on the sacrificial layer 102. The metal layer 103 acts as a mask by undergoing the subsequent aggregating process, and may be formed through a known process such as deposition or sputtering.

Figure 4:
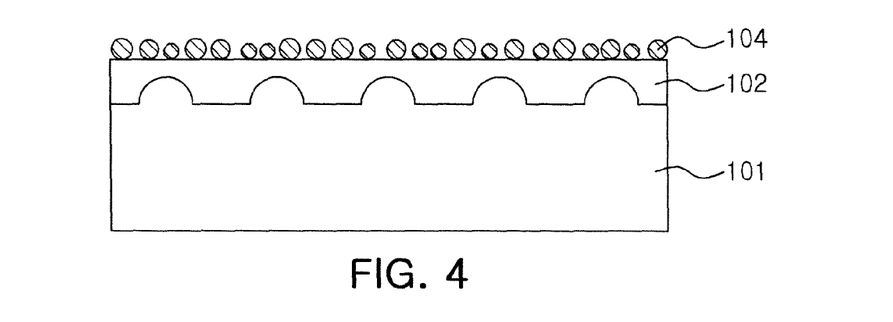
Figure 5:
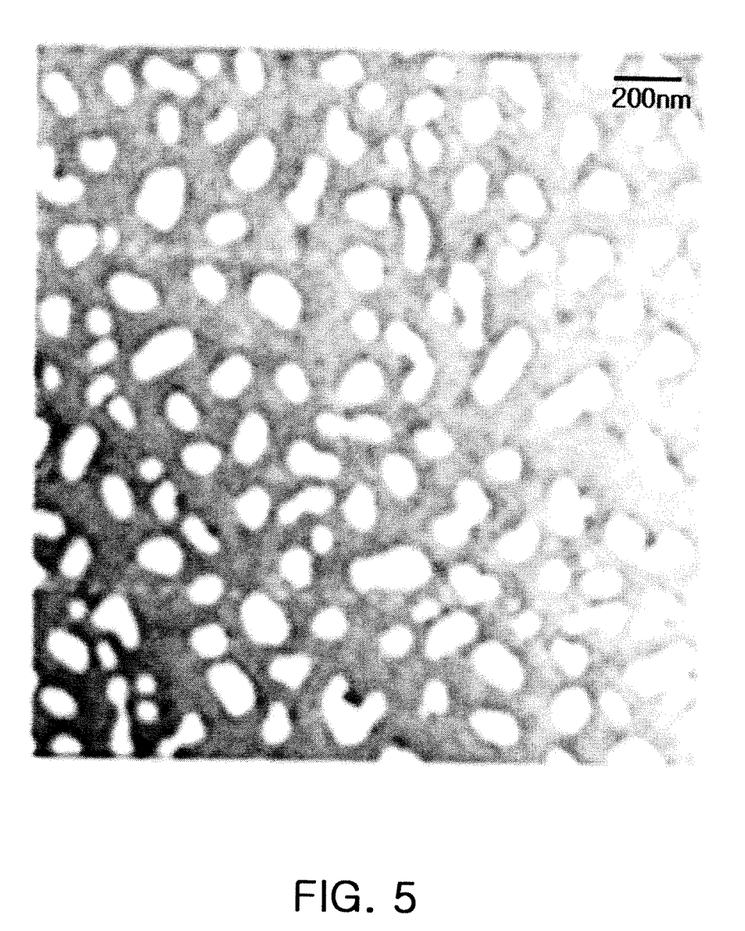

Subsequently, as shown in FIG. 4, the metal layer 103 is aggregated to thereby form a metal cluster mask 104 having open regions exposing the sacrificial layer 102. Due to a high level of interfacial tension of the metal layer 103 with respect to the sacrificial layer 102, the metal layer 103, when heated, undergoes aggregation between metal particles, thereby forming nano-scale clusters, that is, the metal cluster mask 104. FIG. 5 is a microscopic image showing how fine nano-scale metal clusters are formed. When the clusters 104 are used as a mask in an etching process, the underlying sacrificial layer 102 and the substrate 101 exposed between the clusters are etched to thereby form fine nano-scale etched patterns. Accordingly, the substrate 101 may be provided with additional fine patterns other than the first uneven structure P1. Herein, considering that finer clusters are more advantageous to the formation of finer etched patterns, the metal layer 103 may have a thickness t of 250 Å or less, preferably, a thickness of 100 Å or less.

Since this small thickness of the metal layer 103 does not cause any limitations in forming such fine clusters 104, the thickness of the metal layer 103 is not specifically limited. However, in due consideration of process limitations, the metal layer 103 may be 1 Å or greater in thickness, and preferably, be 10 Å or greater in thickness in order to obtain sufficient frequency of the metal clusters 104. In addition, the metal layer 103 may not require an excessively high temperature in a thermal treatment, and may be formed of a material such as Au, Pt, Ni, Ru, Al, Ag, Co, an alloy thereof or the like in due consideration that the metal layer 103 functions as a mask.

In the meantime, the thermal treatment for forming the metal cluster mask 104 is not necessarily performed at a temperature at which metal is melted, and may, generally, be carried out at a temperature of 100° C. or higher. Also, an excessively high temperature may cause serious thermal damage to an underlying transparent electrode layer or a semiconductor layer, and thus, the thermal treatment may be performed at a temperature of 1000° C. or less. Since the complete formation of the clusters 104 can be accomplished when heat is applied thereto for a sufficient amount of time, the thermal treatment may be carried out for 10 seconds or longer. However, even if the thermal treatment is performed for a long time, no additional increase in the effect thereof is admitted, and thermal damage to the substrate 101 may be caused. Considering this, the thermal treatment may be limited to 10,000 seconds or less in duration, preferably, to 1,000 seconds or less. The thermal treatment may be performed by a typical device, for example, an infrared lamp heating element such as an RTA, or a typical furnace. The metal cluster mask 104 formed by such a thermal treatment has grain size of 1 µm in general, and thus etched patterns obtained by using this metal cluster mask 104 may be formed as nano-scale patterns, and furthermore, may be irregular in interval and shape.

Figure 6:
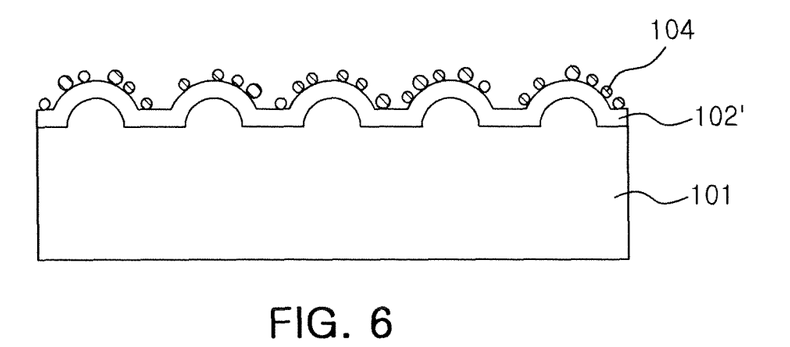

In FIG. 4, the sacrificial layer 102 is illustrated as a having a flat surface, and the mask 104 is formed thereon. However, the sacrificial layer 102 may be formed to correspond to the shape of the first uneven structure P1 of the substrate 101. That is, as shown in FIG. 6, a sacrificial layer 102', when having a relatively small thickness, may have a shape correspond to the shape of the first uneven structure P1, and thus, a metal cluster mask 104' may also be arranged to have a similar shape thereto.

Figure 7:
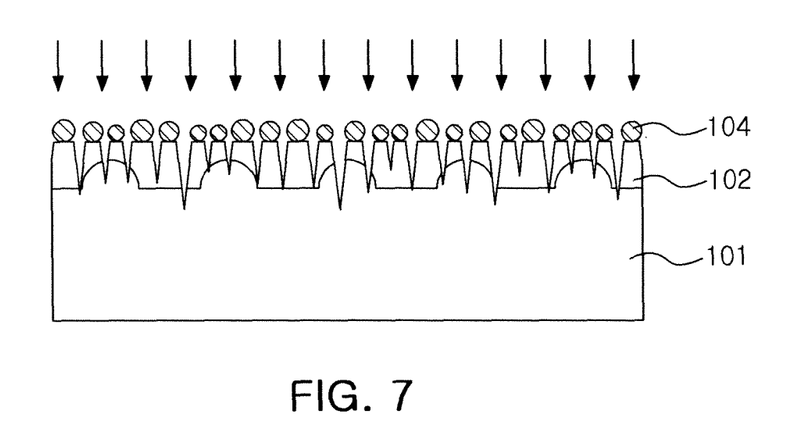

Thereafter, as shown in FIG. 7, the sacrificial layer 102 and the substrate 101 are etched through the open regions of the metal cluster mask 104. This etching process may be referred to as a first etching process in order to distinguish it from a subsequent etching process. The first etching process may be formed by using any typically used etching method, and particularly, a dry etching method may be used. As the dry etching method, an etching method using gases may be utilized, and in this case, the gases may utilize $Cl_2$, $BCl_3$, $CH_4$ or the like, which is capable of etching both the sacrificial layer 102 and the substrate 101. Through such an etching process, the sacrificial layer 102 and the substrate 101 may be etched at the same time. Furthermore, an apparatus for the dry etching may utilize an apparatus such as Induced Coupled Plasma (ICP), Reactive Ion Etch (RIE) or the like. By the first etching process, the sacrificial layer 102, directly underlying the metal cluster mask 104, is etched throughout its entire thickness, while the substrate 101 thereunder is etched only in part in its thickness direction.

Figure 8:
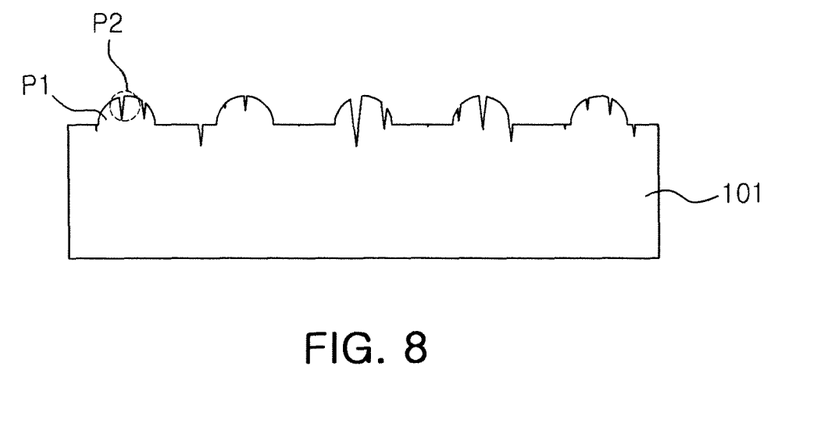

Subsequently, an additional etching process (i.e., a second etching process) is performed in order to remove the metal cluster mask 104 and the sacrificial layer 102. The uneven structure in the substrate 101 formed by this etching process includes the first uneven structure P1 and the second uneven structure P2 as shown in FIG. 8. As described above, the second uneven structure P2 formed by the nano-scale patterns may be smaller than that of the first uneven structure P1, and irregular in terms of size, shape, disposition (e.g., interval) or the like. According to this exemplary embodiment, the substrate 101 has a multiple uneven structure including the first and second uneven structures P1 and P2, so that the possibility that light emitted from an active layer is extracted to the outside without being trapped within the substrate 101 can be increased. Also, since the metal cluster mask is used to form this additional uneven structure, that is, the second uneven structure P2, there is no need to use costly equipment used for photolithography, nano-imprinting or the like, thereby enhancing productivity.

As for the second etching process, a selective dissolution method for dissolving only the sacrificial layer 102 may be used. In this case, it is not an issue as to whether or not the metal cluster mask 104 is etched together with the sacrificial layer 102. This is because no bonding relationship exists between the metal cluster mask 104 and the substrate 101, and thus lifting off only the sacrificial layer 102 therebetween may automatically lead to the removal of the metal cluster mask 104. Therefore, there is no need to use a strong acidic etching solution having a high level of acidity to dissolve the metal cluster mask 104. An etching method that satisfies the aforementioned conditions may include a wet etching method. As for an etching solution for this wet etching method, a Buffered Oxide Etchant or the like may be used as one that is capable of selectively removing the sacrificial layer 102. Besides, various kinds of solutions may be used, and the selection of an etching solution may be considered to be a simple modification made by a person having ordinary skill in the art.

Figure 9:
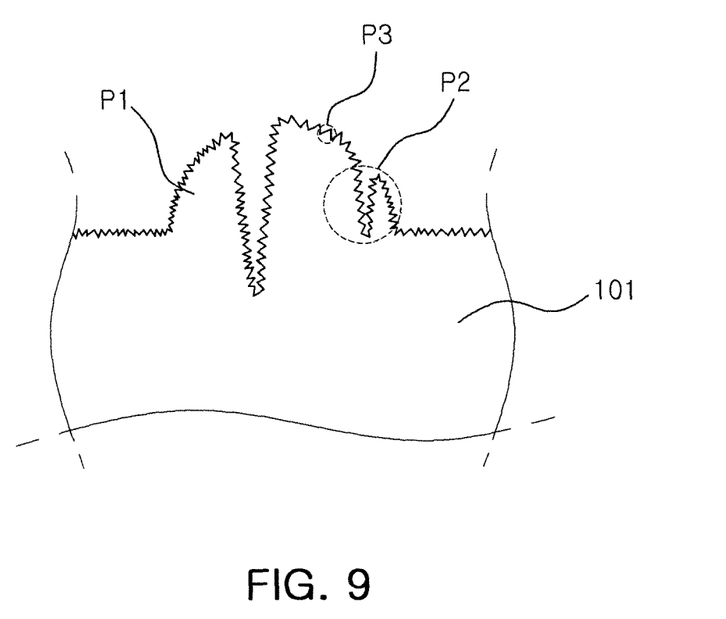
Figure 10:
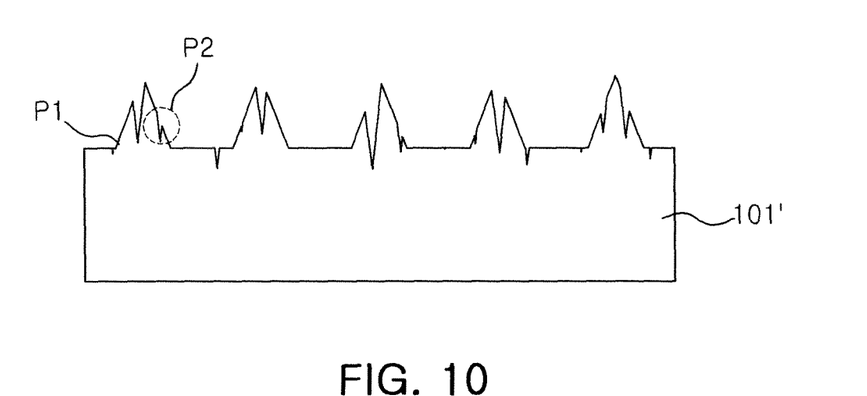

Furthermore, as shown in FIG. 9, an additional uneven structure P3, which is smaller than the first and second uneven structures P1 and P2, may be formed in the substrate 101 in the wet etching process, thereby further enhancing light extraction efficiency. In this exemplary embodiment, the first uneven structure P1 is illustrated as having dome-shaped convex portions; however, the convex portions may have a conical shape or polygonal pyramid shape as shown in FIG. 10, depending on embodiments.

Figure 11:
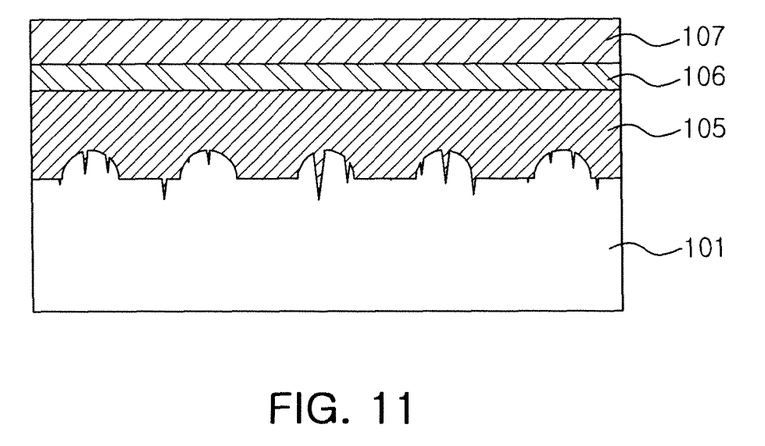

After the multiple uneven structure, namely, the first and second uneven structures P1 and P2 are formed in the substrate 101, a light emitting stack is formed thereon. As shown in FIG. 11, the light emitting stack consists of a first conductivity type semiconductor layer 105, an active layer 106 and a second conductivity type semiconductor layer 107 being sequentially stacked. When those semiconductor layers are grown on the first and second uneven structures P1 and P2 of the substrate 101, dislocation can be effectively prevented, which is caused due to a difference in lattice constant with the substrate 101.

The first and second conductivity type semiconductor layers 105 and 107 may be n-type and p-type semiconductor layers, respectively, and may be formed of a nitride semiconductor. Thus, the first conductivity type and the second conductivity type in this exemplary embodiment, although not limited thereto, may be understood as referring to n-type and p-type, respectively. Furthermore, the first and second conductivity type semiconductor layers 105 and 107 may be formed of a nitride semiconductor, that is, $Al_xIn_yGa_{(1-x-y)}N$ ($0 \leq x \leq 1$, $0 \leq y \leq 1$, $0 \leq x+y \leq 1$) or an AlInGaP-based material. The active layer 106, disposed between the first and second conductivity type semiconductor layers 105 and 107, emits light having a predetermined energy level by electron-hole recombination, and may employ a multi quantum well (MQW) structure in which quantum well and quantum barrier layers are alternatively stacked, for example, an, InGaN/GaN structure. The first and second conductivity type semiconductor layers 105 and 107 and the active layer 106 therebetween, constituting the light emitting stack, may be grown by a known process such as MOCVD, MBE, HVPE or the like.

Figure 12:
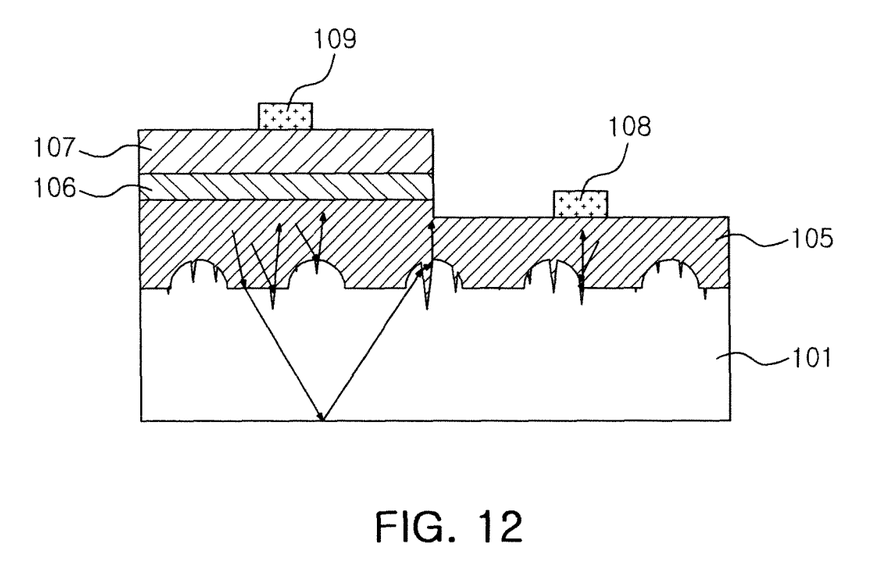

Thereafter, as shown in FIG. 12, the light emitting stack is removed in part to expose the surface of the first conductivity semiconductor layer 105. In this manner, a region for an electrode connection is provided. Thereafter, first and second electrodes 108 and 109 are electrically connected to the first and second conductivity type semiconductor layers 105 and 107, respectively. As shown in FIG. 12, the first and second uneven structures P1 and P2 existing in the interface between the first conductivity type semiconductor layer 105 and the substrate 101 increase the possibility that light traveling toward the substrate 101 after being emitted from the active layer 106 is radiated to the outside without being trapped within the substrate 101 when an electrical signal is applied to the first and second electrodes 108 and 109. Light paths may be varied more variously when a fine pattern, that is, the second uneven structure P2 is formed in the convex portions of the first uneven structure P1 or the like, than in the case in which only the first uneven structure P1 is employed. Thus, in this case, an enhancement in light emission efficiency can be expected.

Figure 13:
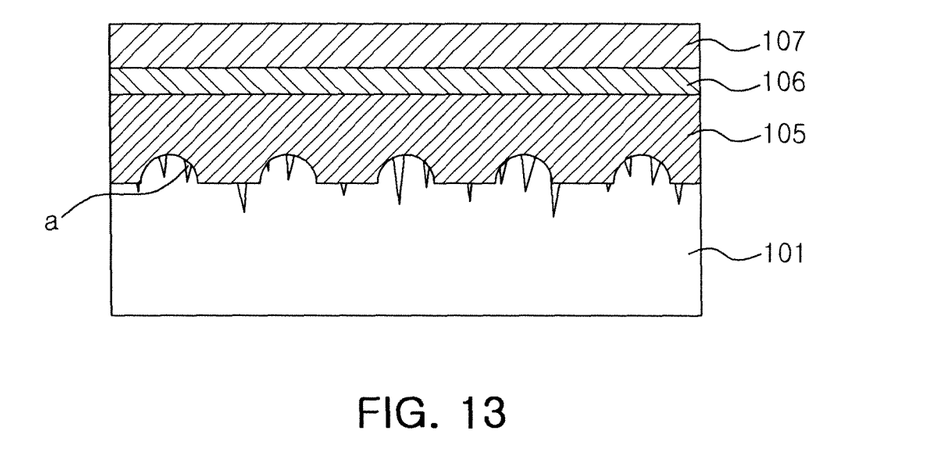

According to this exemplary embodiment of the invention, the first conductivity type semiconductor layer 105 is grown so as to fill the space corresponding to the second uneven structure P2 in the substrate 101. However, as shown in FIG. 13, the first conductivity type semiconductor layer 105 may not occupy the second uneven structure P2. Conditions for not filling the second uneven structure P2 with the growing first conductivity type semiconductor layer 105 are affected by the shape, size or the like of the first and second uneven structures P1 and P2, and may be mainly satisfied by increasing the etching depth of the second uneven structure P2 by performing the etching process for forming the second uneven structure P2 for a relatively long period of time. This utilizes the fact that the lower portion of the second uneven structure P2 does not form a C-plane when the etching period is elongated, thereby making it difficult to grow a nitride semiconductor therefrom. As in an exemplary embodiment shown in FIG. 13, if the first conductivity type semiconductor layer 105 does not occupy the second uneven structure P2, air gaps 'a' may be formed therebetween. This means that fine regions with a low refractive index is interposed therebetween, and thus more light can be reflected from the substrate 101 toward the active layer 106.

Figure 14:
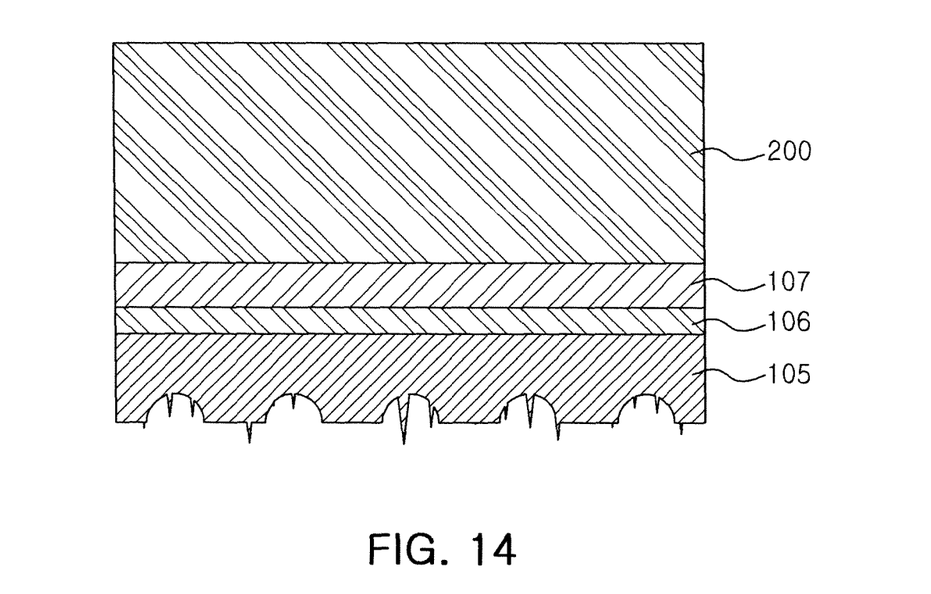
FIGS. 14 and 15 are schematic cross-sectional views for explaining a method of manufacturing a semiconductor light emitting device according to another exemplary embodiment of the present invention.
Figure 15:
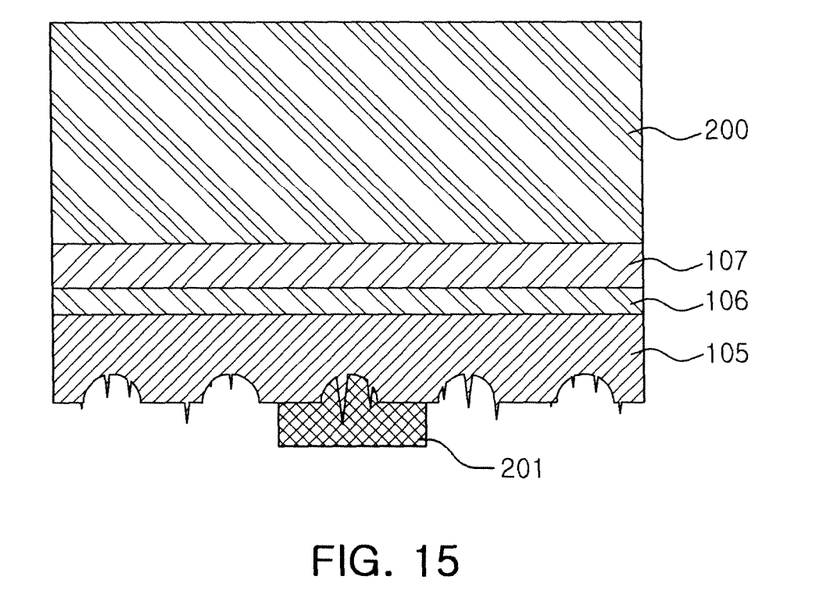

FIGS. 14 and 15 are schematic cross-sectional views illustrating a method of manufacturing a semiconductor light emitting device according to another exemplary embodiment of the present invention. In the previous embodiment, both the first and second electrodes are arranged to face upwards of the device, and the substrate 101 having the multiple uneven structure is included in the final device. However, in the case of this exemplary embodiment, the substrate 101 is removed after the process described with respect to FIG. 11. That is, as shown in FIG. 14, after a support substrate 200 is bonded with the light emitting stack, the substrate 101 is separated from the light emitting stack. The support substrate 200 serves as a support that supports the light emitting stack in a process for removing the substrate 101 provided for semiconductor growth, such as a laser lift-off process. The support substrate 200 may be formed of a material containing one of Au, Ni, Al, Cu, W, Si, Se and GaAs, and utilize, for example, a SiAl substrate.

Thereafter, as shown in FIG. 15, an electrode 201 is formed on the first conductivity type semiconductor layer 105 exposed by the removal of the substrate 101. In this case, the electrode connected with the first conductivity type semiconductor layer 105 may be considered to be a first electrode, and the support substrate 200 may be considered to be a second electrode. In this exemplary embodiment, the multiple uneven structure formed in the substrate 101 may be transferred onto the first conductivity type semiconductor layer 105 such that the first conductivity type semiconductor layer 105 has an uneven shape corresponding thereto. An enhancement in light extraction efficiency can be expected through the multiple uneven structure transferred onto the first conductivity type semiconductor layer 105. According to this exemplary embodiment, the multiple uneven structure on micrometer (μm) and nanometer (nm) scales is subjected to wet etching for the formation of additional patterns, unlike a typical technique in which wet etching is used to form fine patterns in the flat surface of the first conductivity type semiconductor layer 105. As the uneven shape is variously diversified in this manner, more efficient light extraction to the outside can be accomplished.

Figure 16:
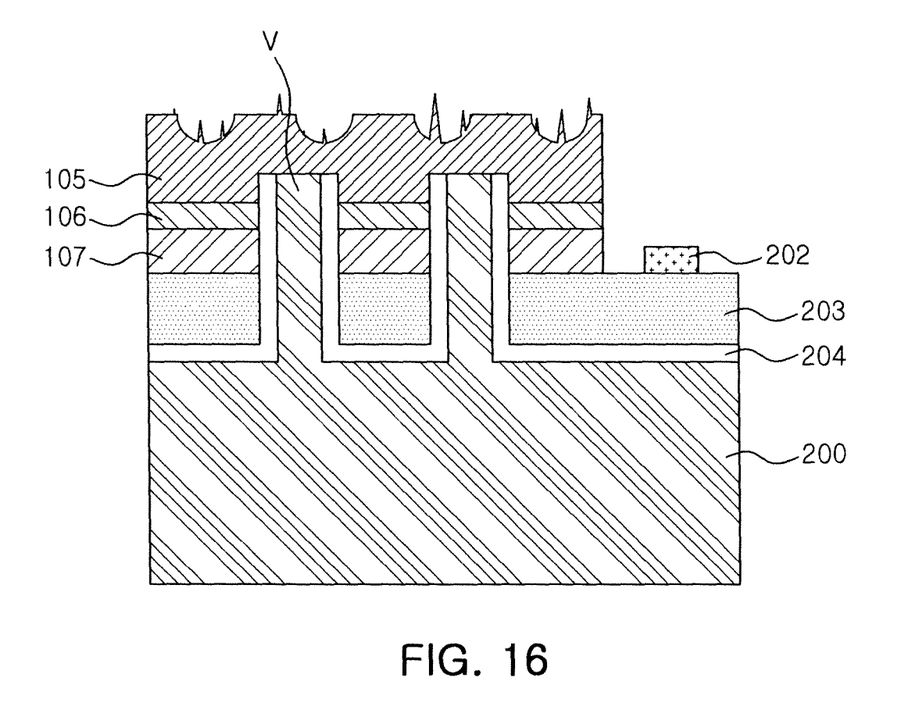
FIG. 16 is a schematic cross-sectional view illustrating a semiconductor light emitting device manufactured according to another exemplary embodiment of the present invention.

FIG. 16 is a schematic cross-sectional view illustrating a semiconductor light emitting device manufactured according to another exemplary embodiment of the present invention. In the previous embodiment of FIG. 15, the support substrate 200 is electrically connected with the second conductivity type semiconductor layer 107. However, according to this exemplary embodiment, the support substrate 200 is electrically connected with the first conductivity type semiconductor layer 105. To this end, a conductive via v electrically connected to the support substrate 200 penetrates the active layer 106 and the second conductivity type semiconductor layer 107, thus being connected to the first conductivity type semiconductor layer 105. In this case, an insulator 204 may be placed so as to insulate the conductivity via v from the active layer 106 and the second conductivity type semiconductor layer 107. A contact layer 203 is disposed between the second conductivity type semiconductor layer 107 and the support substrate 200 and is electrically connected with the second conductivity type semiconductor layer 107. An electrode 202 may be formed on the exposed surface of the contact layer 203 for the supply of an external electrical signal. Even in this exemplary embodiment, an enhancement in light extraction efficiency can be expected due to the multiple uneven structure formed in the first conductivity type semiconductor layer 105.

As set forth above, according to exemplary embodiments of the invention, a semiconductor light emitting device, having a multiple uneven structure capable of improving light extraction efficiency, is provided. Furthermore, by using a manufacturing method proposed by the present invention, such a multiple uneven structure can be efficiently formed in a semiconductor light emitting device.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a semiconductor light emitting device, the method comprising:
   providing a substrate having first and second main surfaces opposing each other, and forming a first uneven structure in the first main surface;
   forming, on the first main surface of the substrate, a sacrificial layer to have an uneven structure corresponding to the first uneven structure of the substrate;
   forming a metal clusters mask having open regions on an upper surface of the sacrificial layer by forming a metal layer on the sacrificial layer and aggregating the metal layer to form a plurality of metal clusters mask so as to expose portions of the upper surface of the sacrificial layer;

dry etching the sacrificial layer through the open regions of the metal clusters mask;

forming a second uneven structure in the substrate by another etching the sacrificial layer throughout its entire thickness, convex portions of the first uneven structure, and the substrate in part in its thickness that are exposed by the open regions of the metal clusters mask;

etching the sacrificial layer and removing the metal clusters mask from the substrate; and forming a light emitting stack on the first and second uneven structures of the substrate.

2. The method of claim 1, wherein the metal layer of the mask is formed of Au, Pt, Ni, Ru, Al, Ag, Go, or an alloy thereof.

3. The method of claim 2, wherein the metal layer has a thickness ranging from 10 Å to 250 Å.

4. The method of claim 2, wherein the plurality of clusters formed by the aggregating of the metal layer are irregular in size and interval.

5. The method of claim 2, wherein at least part of the open regions of the mask is nano-sized.

6. The method of claim 2, wherein the aggregating of the metal layer is performed by subjecting the metal layer to a thermal treatment.

7. The method of claim 6, wherein the thermal treatment is conducted under a temperature condition of between 300° C. to 650° C.

8. The method of claim 1, wherein the sacrificial layer comprises a material selected from the group consisting of a silicon oxide, a silicon nitride, and a titanium oxide.

9. The method of claim 1, wherein the sacrificial layer is formed of a porous material.

10. The method of claim 1, wherein the etching of the sacrificial layer is performed by using a wet etching process.

11. The method of claim 10, wherein the wet etching process forms an additional uneven structure in the substrate.

12. The method of claim 11, wherein the additional uneven structure is smaller than the first and second uneven structures in size.

13. The method of claim 1, wherein the first uneven structure is greater than the second uneven structure in size.

14. The method of claim 1, wherein the first uneven structure is on a micrometer (μm) scale and the second uneven structure is on a nanometer (nm) scale.

15. The method of claim 1, wherein the first uneven structure comprises convex portions that are constant in shape and interval.

16. The method of claim 1, wherein the first uneven structure comprises convex portions having a dome shape.

17. The method of claim 1, wherein the first uneven structure comprises convex portions having a conical shape or polygonal pyramid shape.

18. The method of claim 1, wherein the dry etching process etches the sacrificial layer and the substrate at the same time.

19. The method of claim 1, further comprising separating the substrate from the light emitting stack after the forming of the light emitting stack.

20. The method of claim 19, wherein, in the separating of the substrate, the first and second uneven structures of the substrate are transferred onto one surface of the light emitting stack.

21. The method of claim 1, wherein the forming of the light emitting stack comprises sequentially growing a first conductivity type semiconductor layer, an active layer and a second conductivity type semiconductor layer on the first and second uneven structures of the substrate.

22. The method of claim 21, wherein the first conductivity type semiconductor layer is grown to fill the second uneven structure.

23. The method of claim 21, wherein the first conductivity type semiconductor layer is grown without filling the second uneven structure.

* * * * *